United States Patent
Royle et al.

(10) Patent No.: US 8,310,383 B2
(45) Date of Patent: Nov. 13, 2012

(54) GENERATING A JITTERED DIGITAL SIGNAL USING A SERIALIZER DEVICE

(75) Inventors: David J. Royle, Rockville, MD (US); Mikhail Charny, Montgomery Village, MD (US)

(73) Assignee: JDS Uniphase Corporation, Milpitas, CA (US)

( * ) Notice: Subject to any disclaimer, the term of this patent is extended or adjusted under 35 U.S.C. 154(b) by 47 days.

(21) Appl. No.: 12/978,330

(22) Filed: Dec. 23, 2010

(65) Prior Publication Data

US 2011/0156933 A1    Jun. 30, 2011

Related U.S. Application Data

(60) Provisional application No. 61/291,260, filed on Dec. 30, 2009.

(51) Int. Cl.
*H03M 9/00* (2006.01)
(52) U.S. Cl. .................................. 341/100; 341/101
(58) Field of Classification Search .................. 341/100, 341/101; 375/214, 226, 354, 355, 357, 359, 375/360, 362, 365; 327/164, 165, 172; 713/400, 713/401, 500
See application file for complete search history.

(56) References Cited

U.S. PATENT DOCUMENTS

| | | | |
|---|---|---|---|
| 6,397,042 B1 | 5/2002 | Prentice et al. | 455/67.14 |
| 6,874,107 B2 | 3/2005 | Lesea | 714/725 |
| 7,171,601 B2 | 1/2007 | Frisch | 714/738 |
| 7,315,574 B2 | 1/2008 | Hafed et al. | 375/226 |
| 7,409,616 B1 * | 8/2008 | Sardi et al. | 714/738 |
| 7,471,753 B2 * | 12/2008 | Walker | 375/354 |
| 7,512,177 B2 | 3/2009 | Cranford, Jr. et al. | 375/226 |
| 7,627,790 B2 | 12/2009 | Frisch et al. | 714/700 |
| 2004/0136411 A1 | 7/2004 | Hornbuckle et al. | 370/537 |

* cited by examiner

*Primary Examiner* — Joseph Lauture
(74) *Attorney, Agent, or Firm* — Matthew A. Pequignot; Pequignot + Myers LLC

(57) ABSTRACT

A serializer device is used for generation, from a parallel digital signal, of a clock signal or a serial binary data signal having a pre-determined amount of jitter. A binary number having consecutive groups of ones and zeroes, when serialized by the serializer device, produces a clock signal. By varying the number of ones and zeroes on the binary number, a pre-determined amount of jitter can be generated. Use of sigma-delta modulation in combination with a phase-locked loop circuitry allows one to obtain a smoothly varying jitter of the output signal.

17 Claims, 15 Drawing Sheets

GENERATING A JITTERED DIGITAL SIGNAL USING A SERIALIZER DEVICE

CROSS-REFERENCE TO RELATED APPLICATIONS

The present invention claims priority from U.S. patent application No. 61/291,260 filed Dec. 30, 2009, entitled "Clock jitter generation using SERDES" which is incorporated herein by reference for all purposes.

TECHNICAL FIELD

The present invention relates to testing digital communications systems, and in particular to the generation of jittered digital signals for testing and troubleshooting of digital communications systems.

BACKGROUND OF THE INVENTION

In digital communications, information is transferred between two terminals in the form of binary numbers. The terminals can be two electronic devices, such as a personal computer and a printer. The information can be transferred over a parallel bus, such as in a parallel output port of the personal computer, or over a serial connection, such as a Universal Serial Bus (USB) connection, which is now widespread.

The serial digital information transfer is particularly important for digital communications, because it can serve as an interface between digital systems employing different bit widths and internal communication protocols. Nowadays, disk drives in a personal computer frequently use a serial, not a parallel, connection to the mainframe board. This serial connection can be very fast due to high-speed serial communication enabled by serializer-deserializer (SERDES) integrated circuits. Furthermore, serial digital communication also allows one to use a single carrier (such as a coaxial cable or an optical fiber) for digital information transfer over large distances.

In serial digital communications, the information-carrying signal can be provided with or without a separate clock signal. In systems without the separate clock signal, the receiving circuitry generates an internal clock signal based on transitions between "one" and "zero" levels in the received serial digital signal itself. When the serial digital signal is not very stable in bit frequency or phase, the receiving circuitry may have a difficulty in correctly establishing the internal clock signal. Similarly, when a timing variation is present between the clock and the data signals in systems employing a separate clock signal, the receiving circuitry may have a difficulty in interpreting the received bits as ones or zeroes.

The timing variation of the digital binary signal, either with respect to a clock signal, or with respect to an "ideal" stable signal, is known as jitter. Jitter is commonly present in digital communications systems. Stability with respect to jitter is a very important characteristic of any electronic component or module employing serial or parallel digital communications.

Various standards with respect to tolerable levels of jitter have been developed. The digital communication components and modules need to be tested against these jitter standards. To test stability of electronic components with respect to jitter, a jittered clock reference signal, having a pre-defined amount of jitter, is required.

Cranford et al. in U.S. Pat. No. 7,512,177, incorporated herein by reference, discloses a jittered signal generator including a pulse generator coupled to a phase shifter. The phase shifter includes a plurality of quarter-wavelength lines having electrically variable capacitors. The capacitors are controlled by an arbitrary waveform generator. In operation, the arbitrary waveform generator causes the phase shifter to introduce a pre-defined, time-dependent amount of phase shift into the signal generated by the pulse generator, which introduces a pre-determined amount of jitter.

Frisch in U.S. Pat. No. 7,171,601, incorporated herein by reference, discloses a jitter generator based on a controllable delay line. Referring to FIG. 1, a jitter generator 10 includes a multiplexer 12, a programmable delay circuit 14, a programmable pattern generator 16, and a delay measurement unit 18. In a normal operating mode of the jitter generator 10, the multiplexer 12 delivers an input ("VIN") signal to the delay circuit 14, and the delay circuit 14 delays the VIN signal by varying amounts of time to produce a jittery "TEST" signal. Clocked by a jitter clock signal JCLK, the pattern generator 16 supplies a sequence of digital "DELAY" words to the delay circuit 14, and each successive DELAY word controls a delay of the delay circuit 14. With the pattern generator 16 programmed to produce a suitable DELAY data sequence, the jitter generator 10 can produce a jittery TEST signal having a variety of jitter frequencies and amplitudes.

Jittered signal generators of the prior art commonly suffer from a drawback of complexity. By way of example, the multiplexor 12, the programmable delay circuit 14, the programmable pattern generator 16, and a delay measurement unit 18 of the prior-art jitter generator 10 of FIG. 1 can occupy a significant area on a printed circuit board.

The prior art is lacking a jittered signal generator that would be compact, simple, and inexpensive to implement. It is desirable that a jittered signal generator have a small number of electronic modules, for example two or even one module. The present invention provides such a solution.

SUMMARY OF THE INVENTION

In the present invention, a serializer device is used for generation, from a parallel digital signal, of a clock signal or a serial binary data signal having a pre-determined amount of jitter. Modern field programmable gate arrays (FPGA) implemented serializer-deserializer (SERDES) devices, while being relatively inexpensive, can operate at speeds of a few gigabit per second. A simple source of a jittered serial digital signal at speeds of a few hundred megabit per second can be easily constructed using a SERDES device.

In accordance with the invention, there is provided a jittered signal generator for generating a jittered digital signal having first and second signal levels, comprising:

a binary number generator for generating a first binary number having adjacent first and second groups of bits of all ones and all zeroes, respectively; and a serializer device coupled to the binary number generator, for serializing the first binary number forming a serially outputted group of bits of all ones and a serially outputted group of bits of all zeroes, so as to obtain the jittered digital signal, wherein the serially outputted group of bits of all ones corresponds to the first signal level, and the serially outputted group of bits of all zeroes corresponds to the second signal level of the jittered digital signal.

In accordance with another aspect of the invention, there is further provided a method for generating a jittered digital signal having first and second signal levels, the method comprising:

(a) generating a first binary number having adjacent first and second groups of bits of all ones and all zeroes, respectively; and (b) serializing the first binary number using a serializer device forming a serially outputted group of bits of all ones and a serially outputted group of bits of all zeroes, so as to obtain the jittered digital signal, wherein the serially outputted group of bits of all ones corresponds to the first signal level, and the serially outputted group of bits of all zeroes corresponds to the second signal level of the jittered digital signal.

The jittered digital signal can be obtained by providing to the serializer more than two groups of ones and zeroes of different size, and/or by varying the number of bits in the first group of all ones, in the second group of all zeroes, or in both groups. The number of bits can be varied by cyclically shifting the first binary number using a barrel-type bit shifter. The barrel shifter is digitally controlled by a generator of a desired jitter pattern. A sigma-delta shifter coupled to the barrel-shifter, used in conjunction with a phase-locked feedback loop (PLL) coupled to an output of the serializer device, can be employed to produce a smoothly varying output jitter pattern.

BRIEF DESCRIPTION OF THE DRAWINGS

Exemplary embodiments will now be described in conjunction with the drawings, in which.

DETAILED DESCRIPTION OF THE INVENTION

While the present teachings are described in conjunction with various embodiments and examples, it is not intended that the present teachings be limited to such embodiments. On the contrary, the present teachings encompass various alternatives, modifications and equivalents, as will be appreciated by those of skill in the art.

Figure 1:
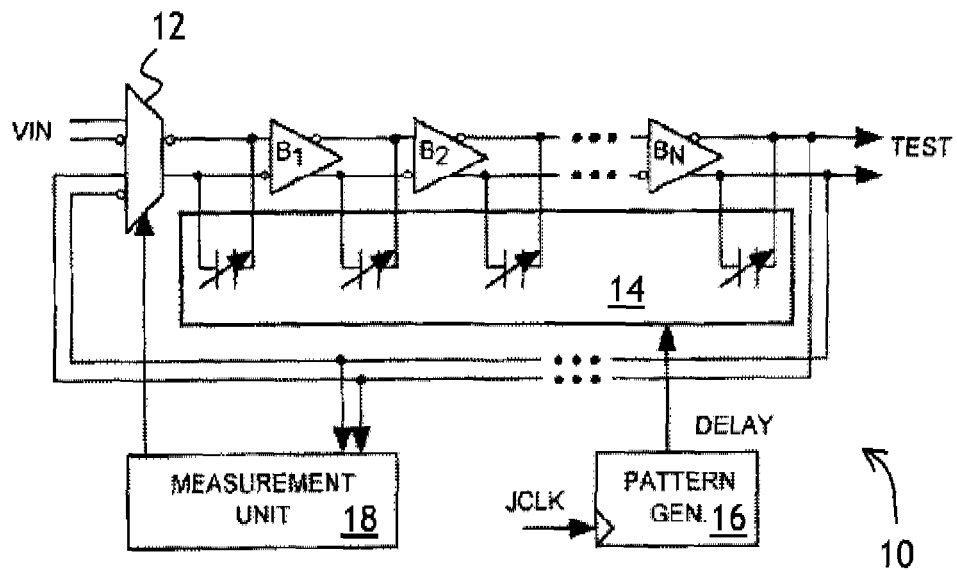
FIG. 1 is a block diagram of a prior-art generator of a jittered signal.
Figure 2:
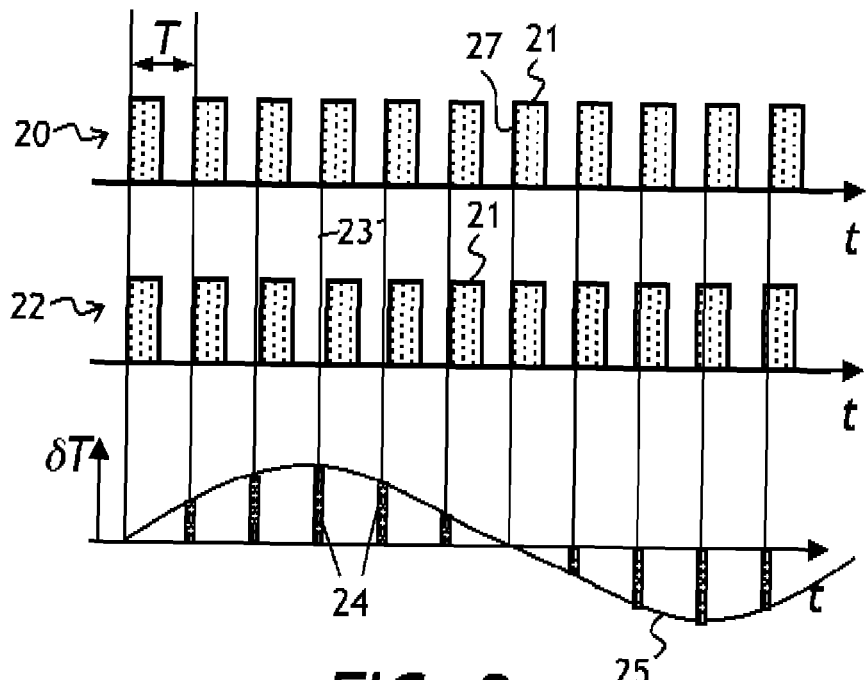
FIG. 2 is a prior-art timing diagram showing an ideal clock signal and a clock signal having a sinusoidal jitter pattern.

Referring to FIG. 2, an ideal clock signal 20 includes a train of pulses 21 having raising edges 27 disposed at equal time intervals T from each other. In a jittered clock signal 22, the raising edges 27 of the pulses 21 are disposed at generally uneven time intervals. The jitter, or the temporal displacement of the raising edges 27 of the pulses 21 of the jittered clock signal 22 from ideal positions 23, is plotted at 24. The jitter 24 has a sinusoidal envelope 25. The tolerance of a digital device to jitter is frequently defined using maximum tolerable amplitude of the sinusoidal jitter 25.

Figure 3:
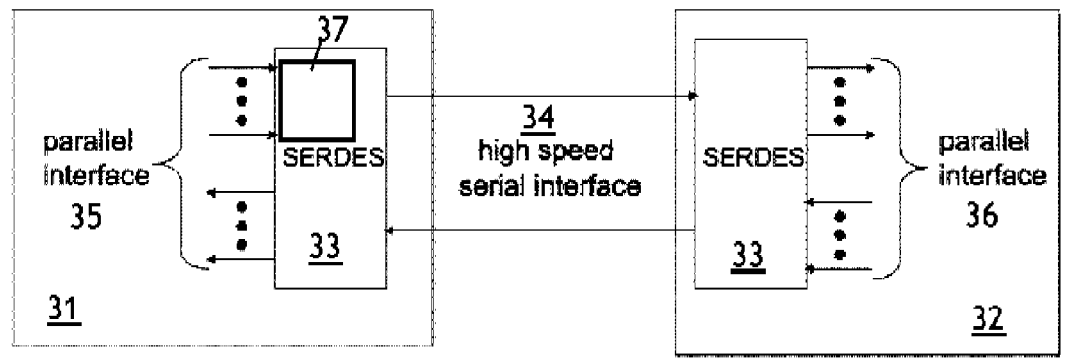
FIG. 3 is a prior-art block diagram of a high-speed serial link employing a pair of serializer-deserializer (SERDES) devices.

Turning to FIG. 3, a typical high-speed serial link 30 between terminals 31 and 32 includes two serializer-deserializer (SERDES) devices 33, one in the terminal 31 and one in the terminal 32. Two SERDES devices 33 establish a high-speed serial interface 34 between the terminals 31 and 32 having identical or different parallel interfaces 35 and 36, respectively. The high-speed serial link 30 is a typical application for the SERDES devices 33.

Figure 4A:
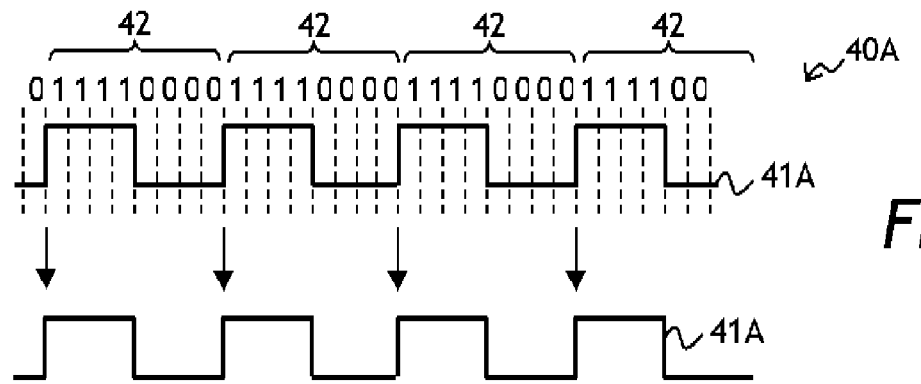
FIGS. 4A and 4B are timing diagrams illustrating generation of a jittered signal using a SERDES device, according to the invention.
Figure 4B:
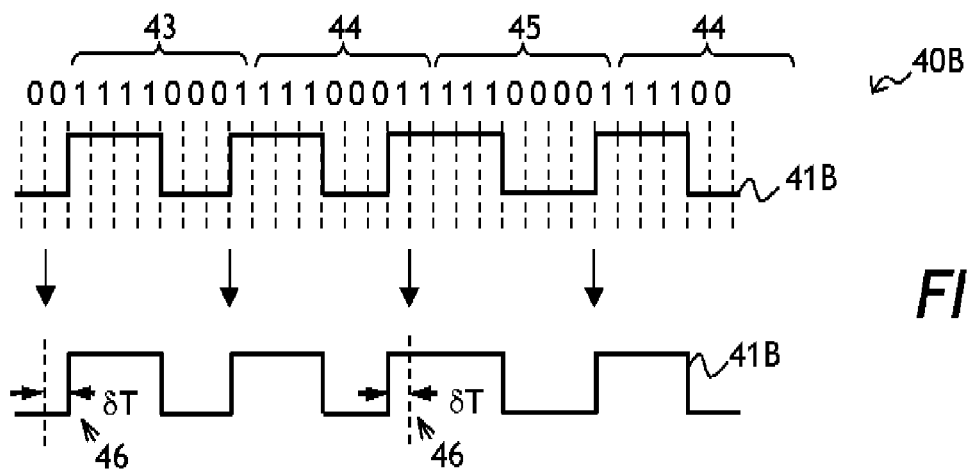

Referring now to FIGS. 4A and 4B, an application of a serializer unit 37 of the SERDES device 33 for jitter generation according to the invention is illustrated by means of timing diagrams 40A and 40B, respectively. The timing diagram 40A of FIG. 4A illustrates a process of generation of an ideal clock signal 41A by the 8-bit serializer unit 37 of the SERDES 33. To generate the ideal clock signal 41A, a binary number 42 including adjacent groups of four "ones" and four "zeros", "11110000", is applied to the serializer unit 37. The serializer unit 37 generates the ideal clock signal 41A in form of symmetrical pulses at a fixed frequency. The serially outputted group of bits of all ones commonly corresponds to a high signal level, and the serially outputted group of bits of all zeroes commonly corresponds to a low signal level of the output pulses. In the example given, the frequency of the ideal clock signal 41A is one-eighth of the bit rate of the SERDES 33. For example, if the SERDES 33 operates at the frequency of 4.97664 GHz, the ideal clock signal will have a frequency of 622.08 MHz.

The timing diagram 40B of FIG. 4B illustrates a process of generation of a jittered clock signal 41B by the 8-bit serializer unit 37. In the timing diagram 40B, binary numbers 43, 44, and 45 are applied to the serializer unit 37, one after the other. The binary number 43 includes adjacent groups of four "ones", three "zeroes", and one "one", "11110001". The binary number 44 includes adjacent groups of three "ones", three "zeroes", and two "ones", "11100011". The binary number 45 includes adjacent groups of three "ones", four "zeroes", and one "one", "11100001". When these numbers are inputted one by one into the serializer unit 37, the output signal 41B of the serializer unit 37 will no longer be symmetrical pulses at a fixed frequency. The output signal 41B will be jittered. The magnitude of jitter, δT, is shown at 46.

Figure 5:
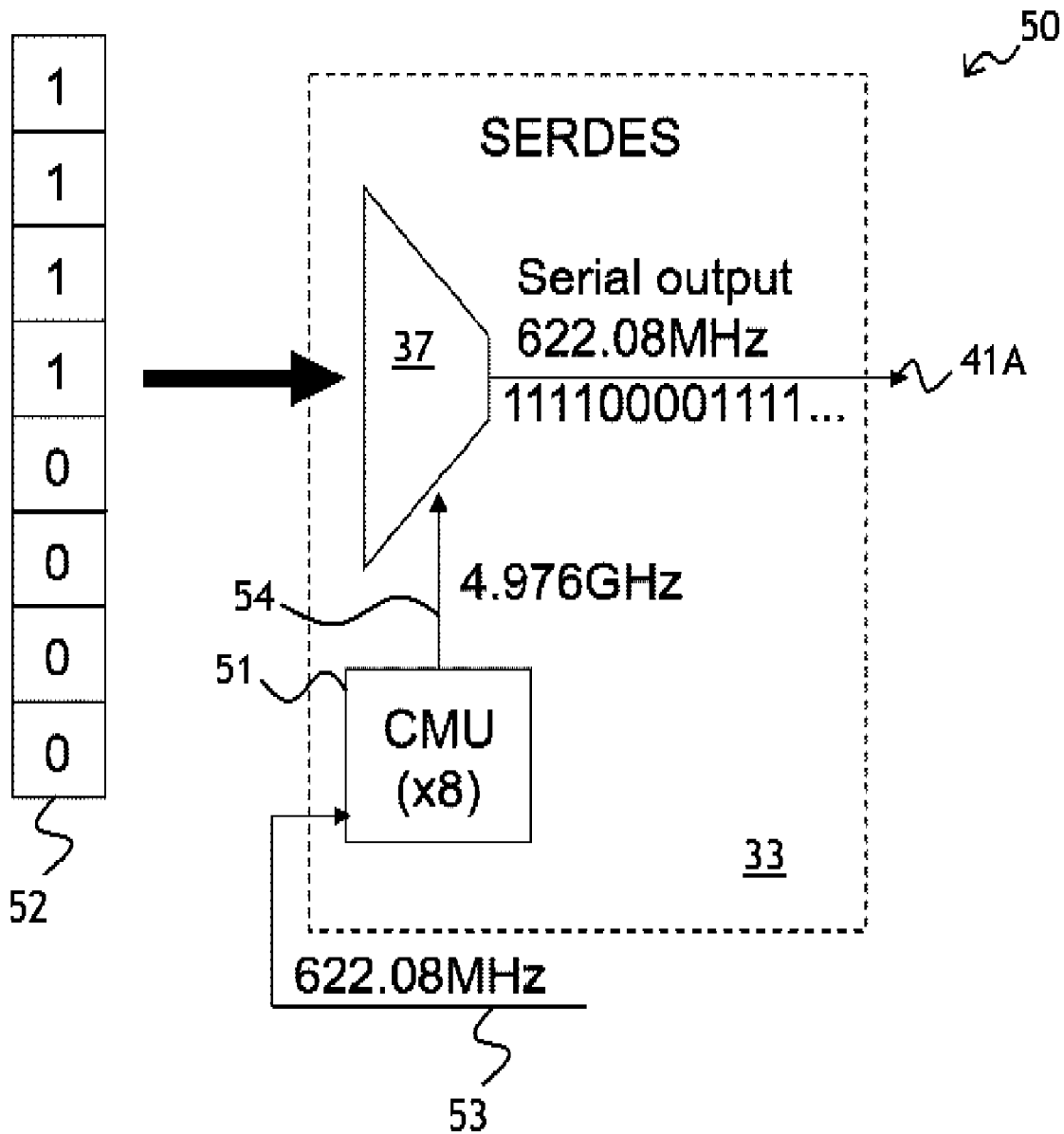
FIG. 5 is a block diagram of a jittered signal generator of the invention, illustrating SERDES operation for generating a clock signal.

Turning to FIG. 5, use of the SERDES 33 for generating the clock signal 41A is further illustrated by means of a block diagram of a jittered signal generator 50 including a SERDES input register 52 and the SERDES device 33. The SERDES device 33 includes an optional ×8 Clock Multiplier Unit (CMU) 51. The SERDES input register 52, containing the binary number 42, including adjacent groups of four "ones" and four "zeros", "11110000", is coupled to the serializer unit 37. In operation, a stable reference signal 53 at the frequency of 622.08 MHz is applied to the CMU 51. The CMU 51 produces an output signal 54 at a frequency of eight times the frequency of the reference signal 53, that is, 4.976 GHz. The output signal 54 is used to clock the serializer unit 37 of the SERDES 33. The serializer unit 37 outputs the clock signal 41A at the frequency of 622.08 MHz. As shown in FIG. 4B, changing the input binary number stored in the SERDES input register 52, that is, sequentially storing the numbers "1111001", "11100011", "11100001", . . . instead of the number "11110000", will result in the output signal of the SERDES 33 being jittered in a controllable fashion.

As is understood by one skilled in the art, the frequency of operation and the number of bits in a serialized word of the jittered signal generator 50 may be different from the ones disclosed herein. Also, the SERDES input register 52 can contain a binary number having unequal numbers of ones and zeroes. In general, to obtain an output signal using the SERDES 33, the following steps need to be taken:
(a) generating a number including adjacent first and second groups of bits of all ones and all zeroes, respectively, and
(b) serializing the generated number using the serializer unit 37, forming a serially outputted group of bits of all ones and a serially outputted group of bits of all zeroes.

The serially outputted group of bits of all ones will correspond to one signal level (for example, "high" signal level), and the serially outputted group of bits of all zeroes will correspond to the other signal level (for example, "low" signal level).

To jitter the output signal, the number generated in step (a) can have unequal numbers of ones and zeroes; and/or the number generated in step (a) can have more than two groups of ones and zeroes. Alternatively or in addition, the steps (a) and (b) can be repeated, while changing the total number of bits in at least one of the first group and the second group of the number of step (a). According to the invention, the changing of the total number of bits in the first in the second groups of bits is preferably done using a cyclic shifting of an initial number. An apparatus for achieving such cyclic shifting will now be described.

Figure 6:
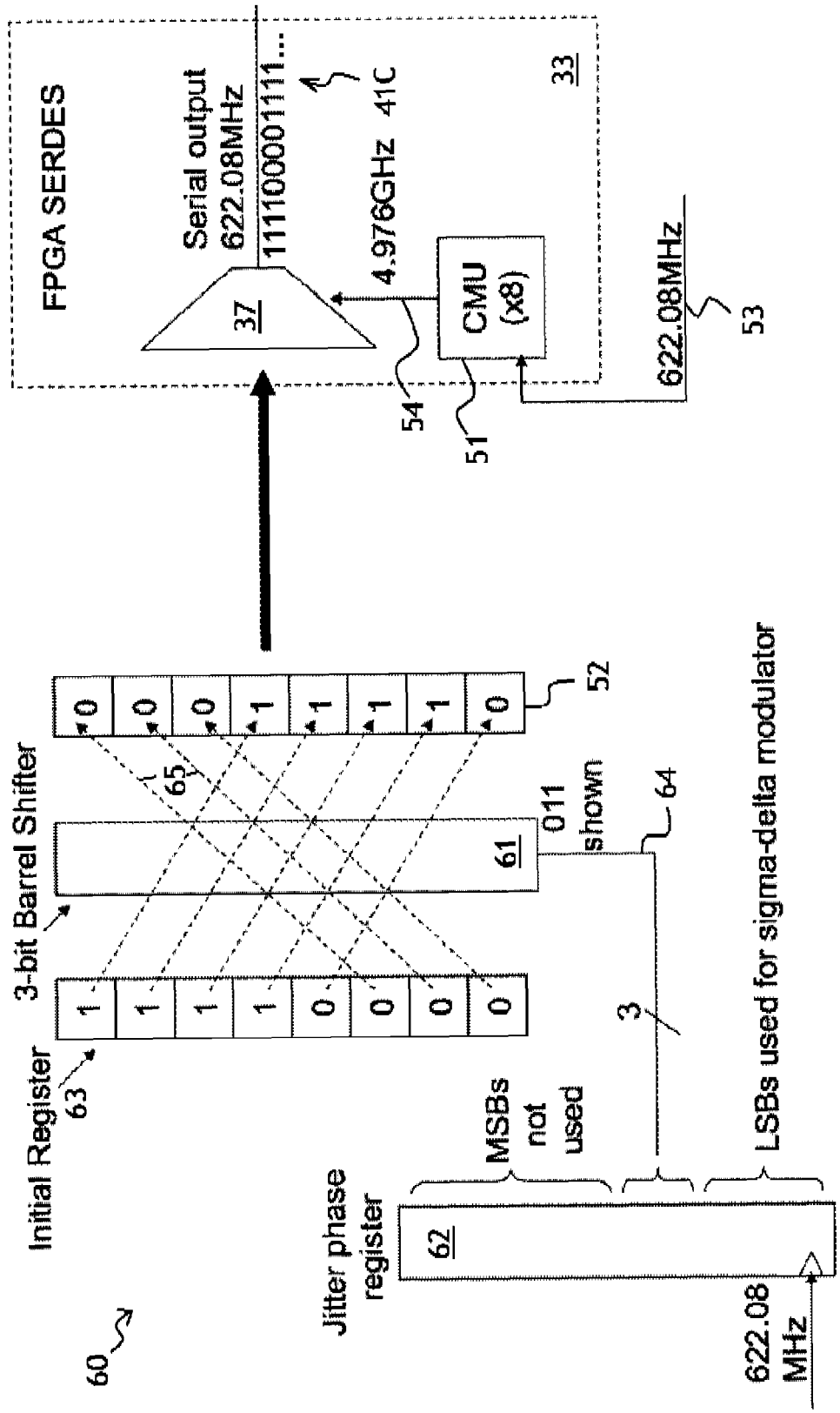
FIG. 6 is a block diagram of a jittered signal generator of FIG. 5, illustrating generation of a controlled amount of jitter using a barrel shifter coupled to the SERDES of FIG. 5.

Referring to FIG. 6, a jittered signal generator 60 of the invention includes a 3-bit barrel shifter 61, a jitter phase register 62, an initial register 63, the SERDES 33 having the serializer unit 37, and the SERDES input register 52. In operation, three bits of a number stored in the jitter phase register 62 are used as a jitter control signal, to control the barrel shifter 61 via a 3-bit control bus 64. The function of the barrel shifter is to cyclically shift a number (for example, "11110000") stored in the initial register 63. The cyclical shift is shown by arrows 65 in FIG. 6. Then, the shifted number is placed into the SERDES input register 52, for serialization by the serializer unit 37. Thus, a pre-determined amount of jitter in an output signal 41C can be generated by the jittered signal generator 60 by controlling the barrel shifter 61 through the control bus 64. For example, in FIG. 6, a control binary number "011" is applied to the control bus 64. This causes the barrel shifter 61 to shift a binary number stored in the initial register 63 (in the example shown, the number "11110000"), by three 1-bit positions, because the binary "011" is three. Since the serializer unit 37 operates at a frequency of approximately 5 GHz, shifting by three 1-bit positions causes the output signal to be jittered by three (⅕ GHz), or three 200-ps time intervals. When the control binary number is changed, the magnitude of the cyclical bit shift introduced by the barrel shifter 61 changes; and the magnitude of the generated jitter changes accordingly. The "step size" of the jitter change is, in this case, 200 ps. The least significant bits of the jitter phase register 62 are used for sigma-delta modulation, which will be described in detail further below.

Figure 7:
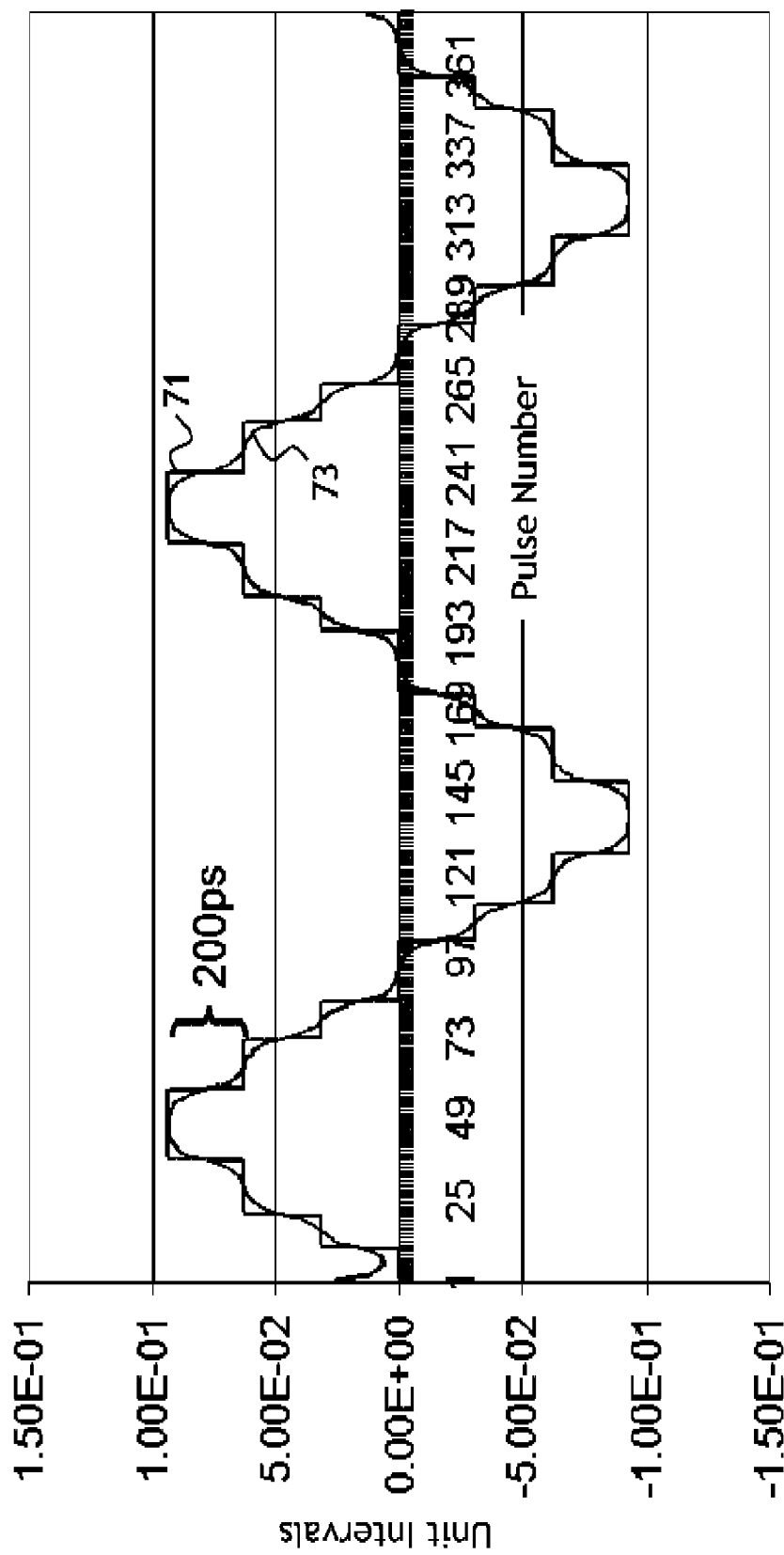
FIG. 7 is a time (or pulse number) dependence of a magnitude of a jitter generated by the jittered signal generator of FIG. 6.

The time dependence of jitter in the output signal 41C is illustrated in FIG. 7, where the magnitude of the jitter is plotted as a function of a pulse number in a pulse sequence of the output signal 41C. The vertical scale is in Unit Intervals (UI), which is the time between bits in a jitter free bit sequence. A stepped trace 71 represents the jitter of the output signal 41C. It is seen that the jitter changes in 200-ps intervals (0.03 UI). A "smoothed" trace 73 represents the jitter that has been smoothed by using a phase-locked feedback loop (PLL) circuit, not shown. An embodiment of a jittered signal generator having a PLL will be described further below.

According to the present invention, sigma-delta modulation can be used to dither the steps in the jitter seen in the unsmoothed trace 71. Sigma-delta modulation, when used together with a PLL circuit, can produce an output signal that is significantly closer to a pure sinusoid than the "smoothed" trace 73 of FIG. 7.

Figure 8:
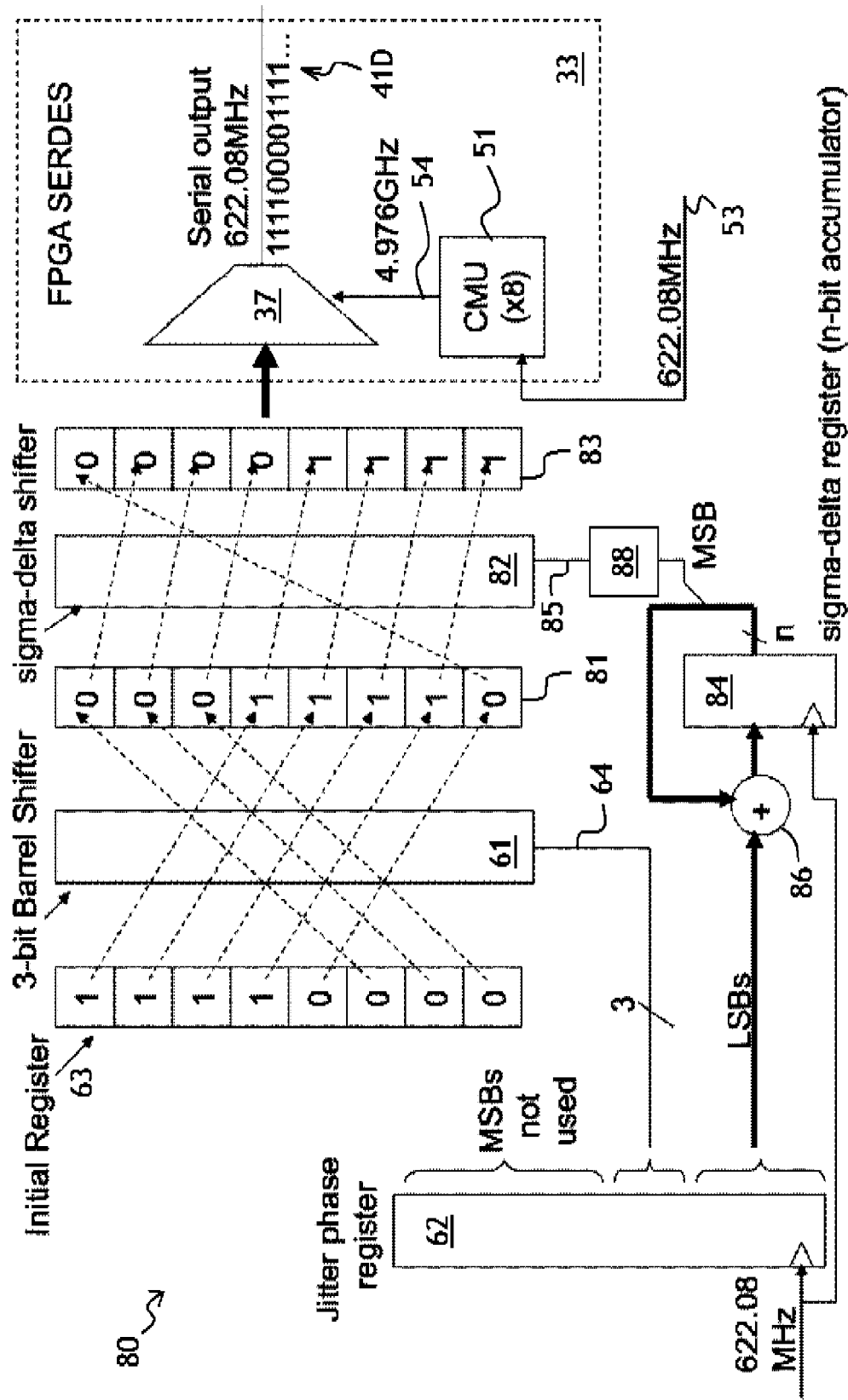
FIG. 8 is a block diagram of a jittered signal generator equipped with a sigma-delta shifter.

Referring now to FIG. 8, a jittered signal generator 80 has the SERDES 33 including the serializer unit 37 and the CMU 51 for clocking the serializer unit 37 at the high frequency of 4.976 GHz, the barrel shifter 61, the jitter phase register 62 for controlling the barrel shifter 61 via the 3-bit control bus 64, the initial register 63 for providing an initial number to the barrel shifter 61, an intermediate register 81 for storing a number that has been cyclically shifted by the barrel shifter 61, a <<sigma-delta>> cyclical shifter 82, a SERDES input register 83, a <<sigma-delta>> register (n-bit accumulator) 84 for controlling the timing of the cyclical shift by the sigma-delta shifter 82 through a <<signma-delta>> control line 85, a transition detector 88, and a summing module 86.

The operation of the jittered signal generator 80 is similar to that of the jittered signal generator 60 of FIG. 6. One important difference is that one more cyclical shifter, specifically, the sigma-delta shifter 82, is used to additionally shift the bits of the binary number already shifted by the 3-bit barrel shifter 61. The sigma-delta shifter 82 is a single-bit shifter. It is controlled by the sigma-delta register 84 and the transition detector 88, whose function is to couple the most significant bit (MSB) of the sigma-delta register 84 to the sigma-delta shifter 82. The summing module 86 functions to add the number represented by the least-significant bits (LSBs) of the number stored in the jitter phase register 62, to a previously obtained number. In other words, the sigma-delta register 84 accumulates least significant bits of the jitter phase register 62. The LSBs of the jitter phase register 62 indicate the proximity of a next 200-ps increment. This arrangement allows the phase of an output signal 41D to be dithered prior to, and in anticipation of, a next 200-ps increment, providing a first-order sigma-delta modulation of the phase of the output signal 41D.

Figure 9:
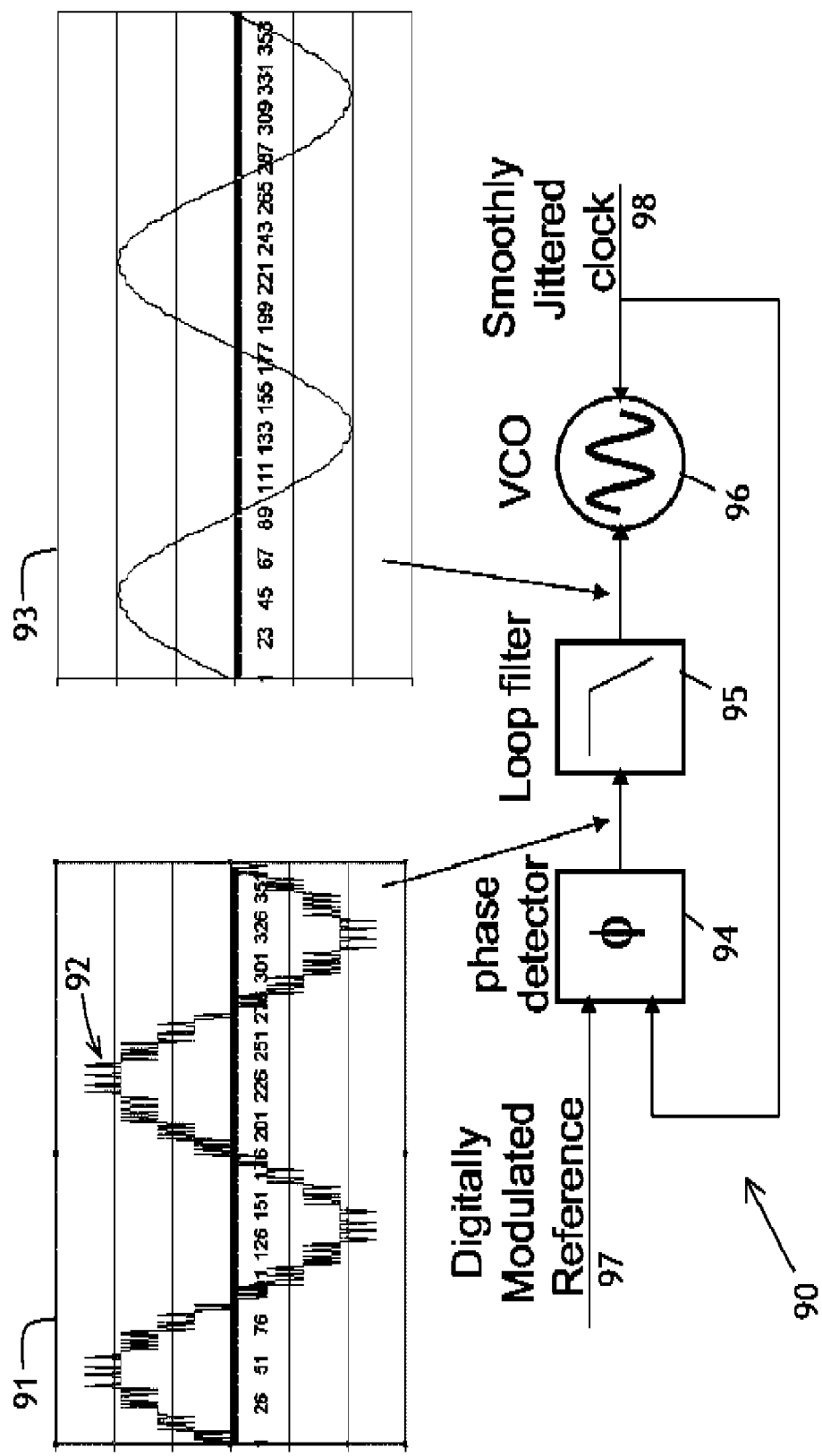
FIG. 9 is a block diagram of a phase-locked feedback loop (PLL) circuit for smoothing the phase variation introduced by the sigma-delta shifter of FIG. 8, shown together with time traces of jitter before and after the smoothing.

Turning to FIG. 9, a plot 91 represents a time dependence (or a pulse number dependence, because the pulses are quasi-periodical) of jitter of the output signal 41D. The sigma-delta modulation results in a high-frequency ripple 92 in the jitter function 91. The function of a phase-locked feedback loop (PLL) circuit 90 is to remove the high-frequency ripple 92, so as to reveal a smooth sine dependence of the jitter. A plot 93 shows the time dependence of jitter of the output signal 41D with the high-frequency ripple 92 removed. The PLL circuit 90 shown in FIG. 9 includes serially coupled phase detector 94, a low-pass loop filter 95, and to a voltage-controlled oscillator (VCO) 96. In operation, the phase detector 94 detects a phase difference between incoming and output signals 97 and 98, respectively; the low-pass loop filter 95 filters out high-frequency components; and the VCO 96 recreates the clock signal with a smoothly varying phase. The PLL circuit 90 thus functions as a low-pass filter, or a smoothing filter, for the phase of the output signal 41D.

Figure 10:
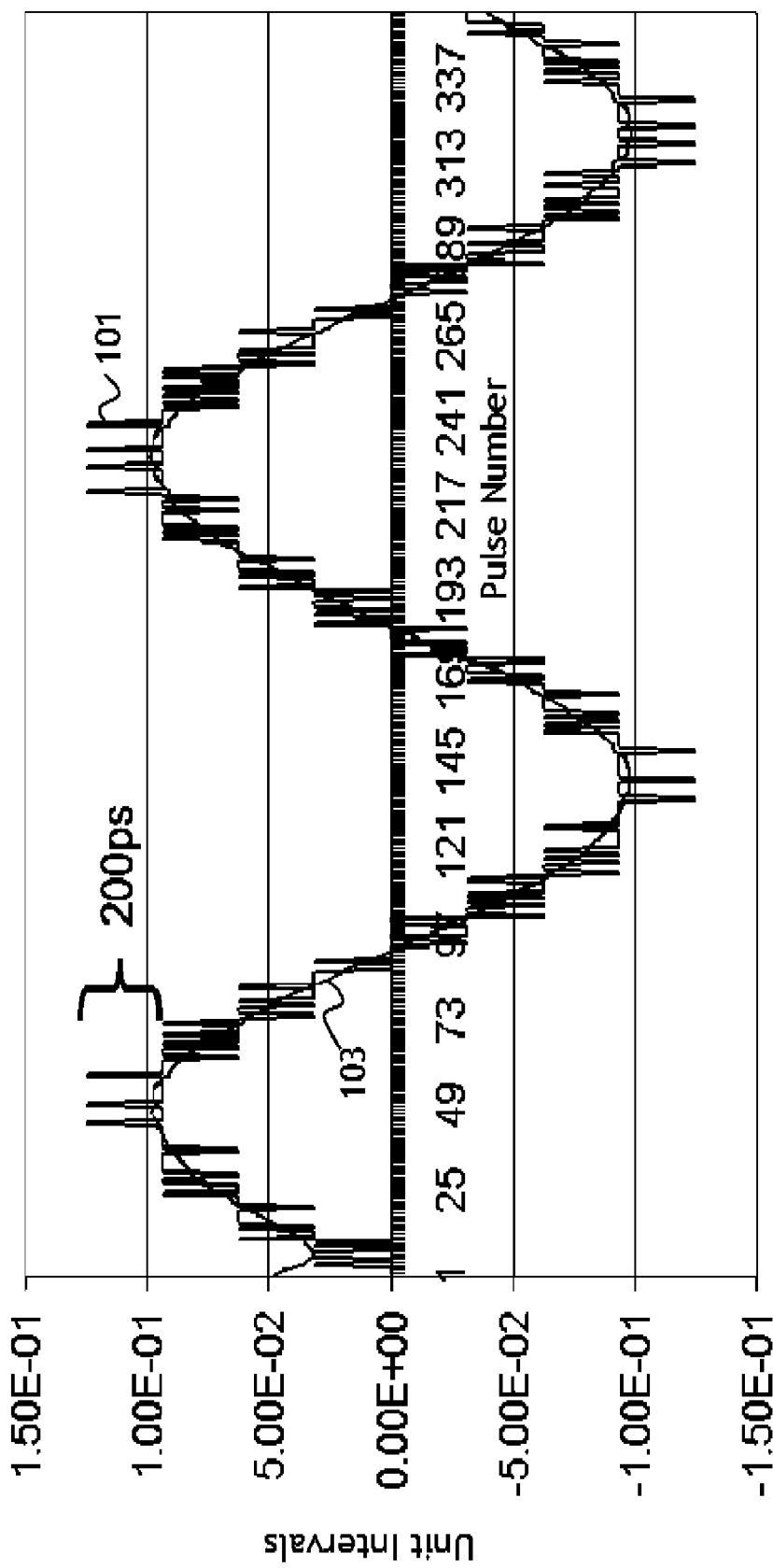
FIG. 10 is superimposed time traces of jitter generated by the jittered signal generator of FIG. 8, before and after smoothing by the PLL circuit of FIG. 9.

Turning to FIG. 10, the plots 91 and 93 of FIG. 9 are overlapped to highlight the smoothing by the PLL 90. A pulse number trace 101 corresponds to the plot 91 of FIG. 9, and a pulse number trace 103 corresponds to the plot 93 of FIG. 9. The output phase, plotted at 103, is much closer to a pure sinusoid than it is in the smoothed trace 73 of FIG. 7, even though the same PLL circuit 90 has been used to obtain the phase variation 73 of FIG. 7. The improved performance of the sigma-delta modulation technique is a result of a high-frequency character of the phase modulation brought forward by the sigma-delta modulation. The high-frequency modulation can be filtered out more efficiently than a simple stepwise modulation shown in the stepped trace 71 of FIG. 7.

As noted above, the magnitude of the jitter in the output signal of the jitter generators 60 and 80 shown in FIGS. 6 and 8, respectively, is determined by a number stored in the phase register 62, which is coupled through the control bus 64 to the barrel shifter 61. In other words, the number stored in the jitter phase register 62 serves as a control signal determining the magnitude of the jitter. By generating a sequence of such numbers and placing them one-by-one in the jitter phase register 62, a jittered signal having a desired time dependence of jitter can be generated.

Figure 11:
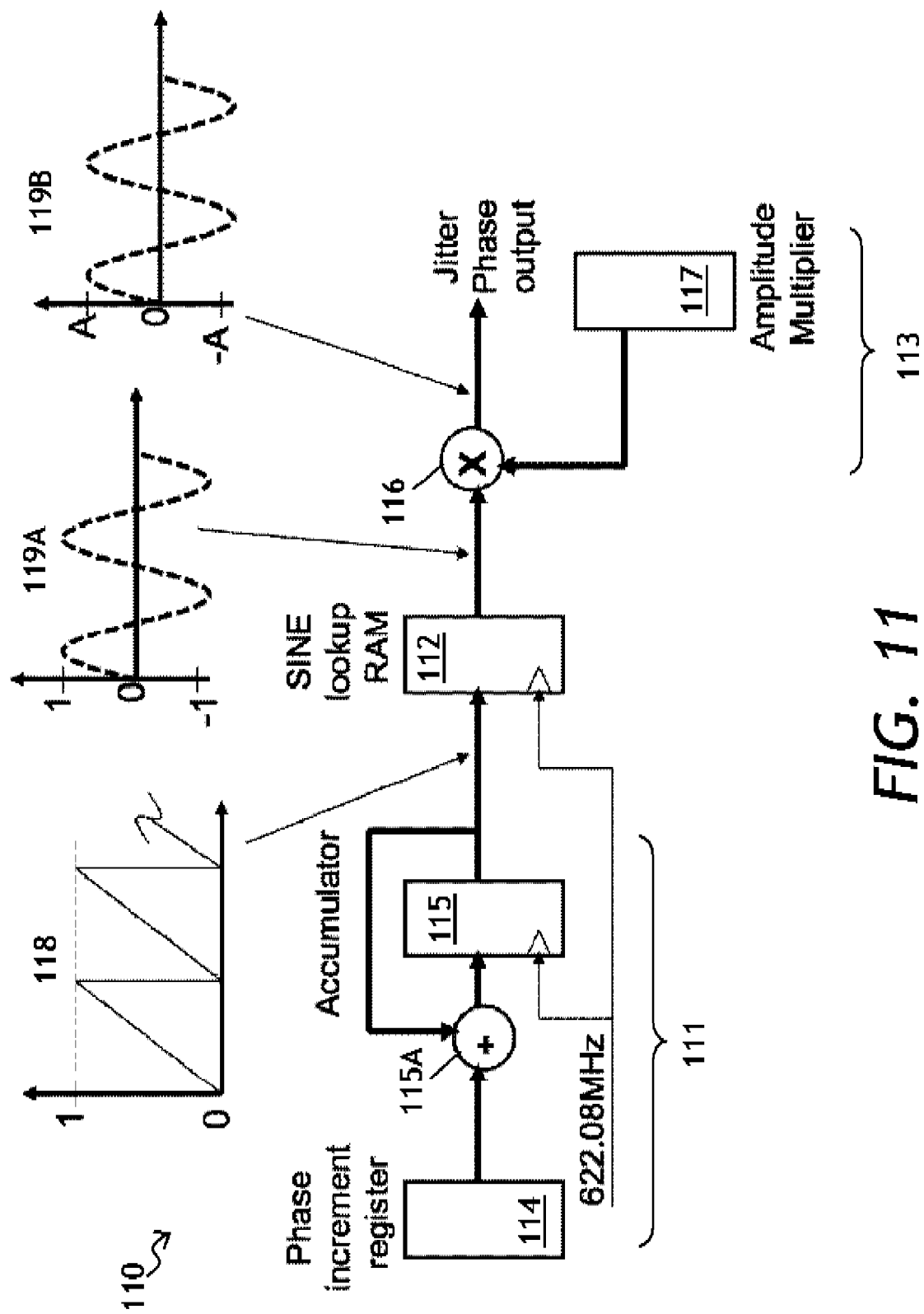
FIG. 11 is a block diagram of a barrel shifter controller for use in the jittered signal generators of FIGS. 6 and 8.

Referring to FIG. 11, a barrel shifter controller 110 is used to generate numbers to be placed into the jitter phase register 62. The barrel shifter controller 110 includes a ramp signal generator 111, a sine lookup RAM 112, and an optional output multiplier 113. The ramp signal generator 111 includes a phase increment register 114, an accumulator register 115, and a summation module 115A. The output multiplier 113 includes a multiplication unit 116 and an amplitude modifier register 117. In operation, the barrel shifter controller 110 is clocked at 622.08 MHz. A phase increment value stored in the phase increment register 114 is added to a running sum of the phase increment values, so as to generate a linearly increasing ramp signal 118. The ramp values are used as addresses of the memory cells of the sine lookup RAM 112, which provides sine values shown at 119A. The sine values are multiplied by the multiplication unit 116 by a value stored in the amplitude modifier register 117. The output jitter control signal is shown at 119B. The output jitter control signal 119B has a sinusoidal shape. Referring back to FIG. 8, the jitter control signal 119B is placed into the jitter phase register 62. Three bits of the jitter phase register 62, coupled to the three-bit bus 64, are used to control the barrel shifter 611; the least significant bits (LSBs) are used for sigma-delta modulation; and the most significant bits (MSBs) are not used in this embodiment. The number of bits used and not used, the clocking frequency, the type of memory, etc., may of course vary.

The jittered signal generators 50, 60, and 80 are clocked at 622.08 MHz. For some FPGA circuits, this clocking frequency may be too high. According to the present invention, the clocking frequency may be effectively lowered by increasing the bit number per a singular serialization step. To handle the increased bit numbers without increasing the registers bit size, multiple registers can be used to make up for the increased bit number. An example embodiment of a jittered signal generator with "concatenated" registers will now be disclosed.

Figure 12:
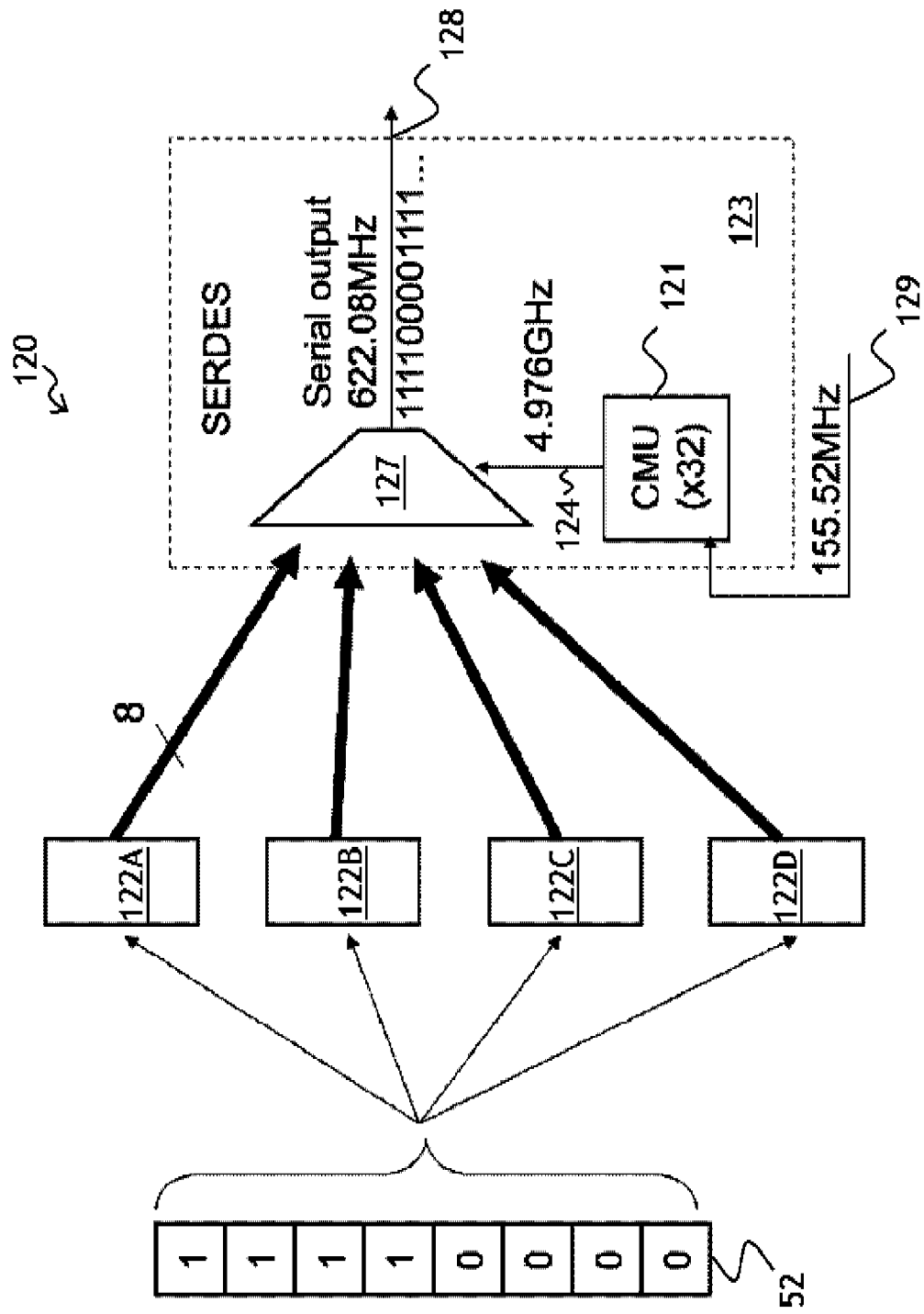
FIG. 12 is a block diagram of a binary number generator including a plurality of registers.

Referring to FIG. 12, a jittered signal generator 120 includes a 32-bit SERDES device 123 and four 8-bit input registers 122A to 122D coupled thereto, each assigned 8 bits of the 32 input bits of a serializer device 127. The serializer device 127 is a part of the 32-bit SERDES device 123. The SERDES device 123 includes an optional x32 Clock Multiplier Unit (CMU) 121. In operation, a stable reference signal 129 at the frequency of 155.52 MHz is applied to the CMU 121. The CMU 121 produces an output signal 124 at the frequency of 32 times the frequency of the reference signal 129, that is, 4.976 GHz. The 8-bit registers 122A to 122D are loaded with the same digital number 42, "11110000". Each of the 8-bit registers 122A to 122D is clocked at 155.52 MHz, while an output serialized signal 128 is at 622.08 MHz.

Referring back to FIG. 5, the jittered signal generator 50 of FIG. 5 is clocked at 622.08 MHz. Referring again to FIG. 12, the jittered signal generator 120 is clocked at 155.52 MHz. Thus, the clock frequency is reduced 4 times, that is, the global clock frequency is reduced by the number of the 8-bit registers 122A to 122D of the jittered signal generator 120.

Figure 13:
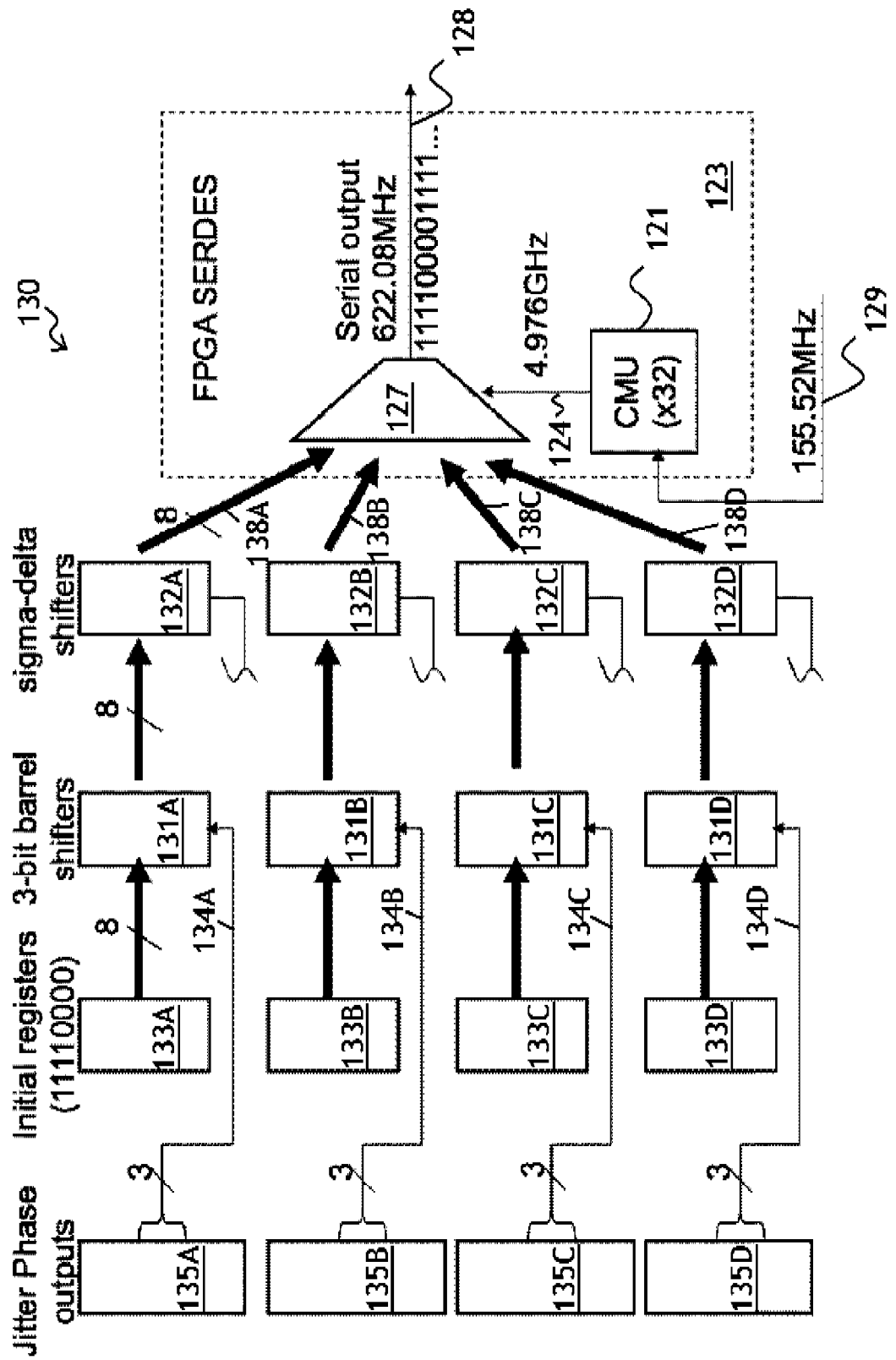
FIG. 13 is a block diagram of the binary number generator of FIG. 12, including a plurality of barrel shifters and sigma-delta shifters.

Referring now to FIG. 13, a jittered signal generator 130 includes four initial binary number registers 133A to 133D, each for storing an initial binary number having two adjacent groups of bits of all ones and all zeroes; four three-bit barrel shifters 131A to 131D controlled by four jitter phase outputs 135A to 135D via four 3-bit buses 134A to 134D, for cyclically shifting the bits of an initial binary number provided by the four initial binary number registers 133A to 133D, respectively, so as to generate a plurality of intermediate binary numbers; and four optional sigma-delta shifters 132A to 132D, for sigma-delta modulation of the corresponding intermediate numbers. The operation of the jittered signal generator 130 is similar to that of the jittered signal generator 80 of FIG. 8. One difference is that four initial registers 133A to 133D are used instead of the single initial register 63; four 3-bit barrel shifters 131A to 131D are used instead of the single barrel shifter 61; and four sigma-delta shifters 132A to 132D are used instead of the single sigma-delta shifter 82. Another difference is that the internal clock frequency of the jittered signal generator 130 is four times less than the clock frequency of the jittered signal generator 80, due to using four registers in parallel, instead of just one register.

The following Table 1 illustrates the advancement of three jitter output control bits of the jitter phase outputs 135A to 135D, controlling the three-bit barrel shifters 131A to 131D via the three-bit buses 134A to 134D. The bits shown are for three successive clock positions at 155.52 MHz clock frequency.

TABLE 1

|  | Clock 1 | Clock 2 | Clock 3 |
| --- | --- | --- | --- |
| Jitter phase output 135A | 010 | 010 | 011 |
| Jitter phase output 135B | 010 | 011 | 011 |
| Jitter phase output 135C | 010 | 011 | 011 |
| Jitter phase output 135D | 010 | 011 | 011 |

With regards to Table 1 above, in the jittered signal generator 60 of FIG. 6 clocked at 622.08 MHz, the phase of the output signal 41C would have changed on the $6^{th}$ clock. In the jittered signal generator 130 of FIG. 3, the phase of the output signal 128 has changed in the second barrel shifter 131B controlled by the second jitter phase output 135B, on the second clock (Clock 2 in Table 1 above).

As noted above, sigma-delta shifters 132A to 132D are optional. However, their use, in combination with a PLL circuit similar to the PLL circuit 90 of FIG. 9, will greatly reduce granularity of jitter. The reduced granularity can be seen by comparing FIGS. 7 and 10, specifically by comparing the plots 73 and 103 showing the jitter of output pulses at the output of the PLL circuit 90. The number of registers used in parallel may vary; the choice depends on bit size of SERDES input register and the FPGA clock frequencies available. In general, the clock frequency for clocking the jittered signal generator 130 is reduced n times, where n is the number of the registers used in parallel.

Figure 14:
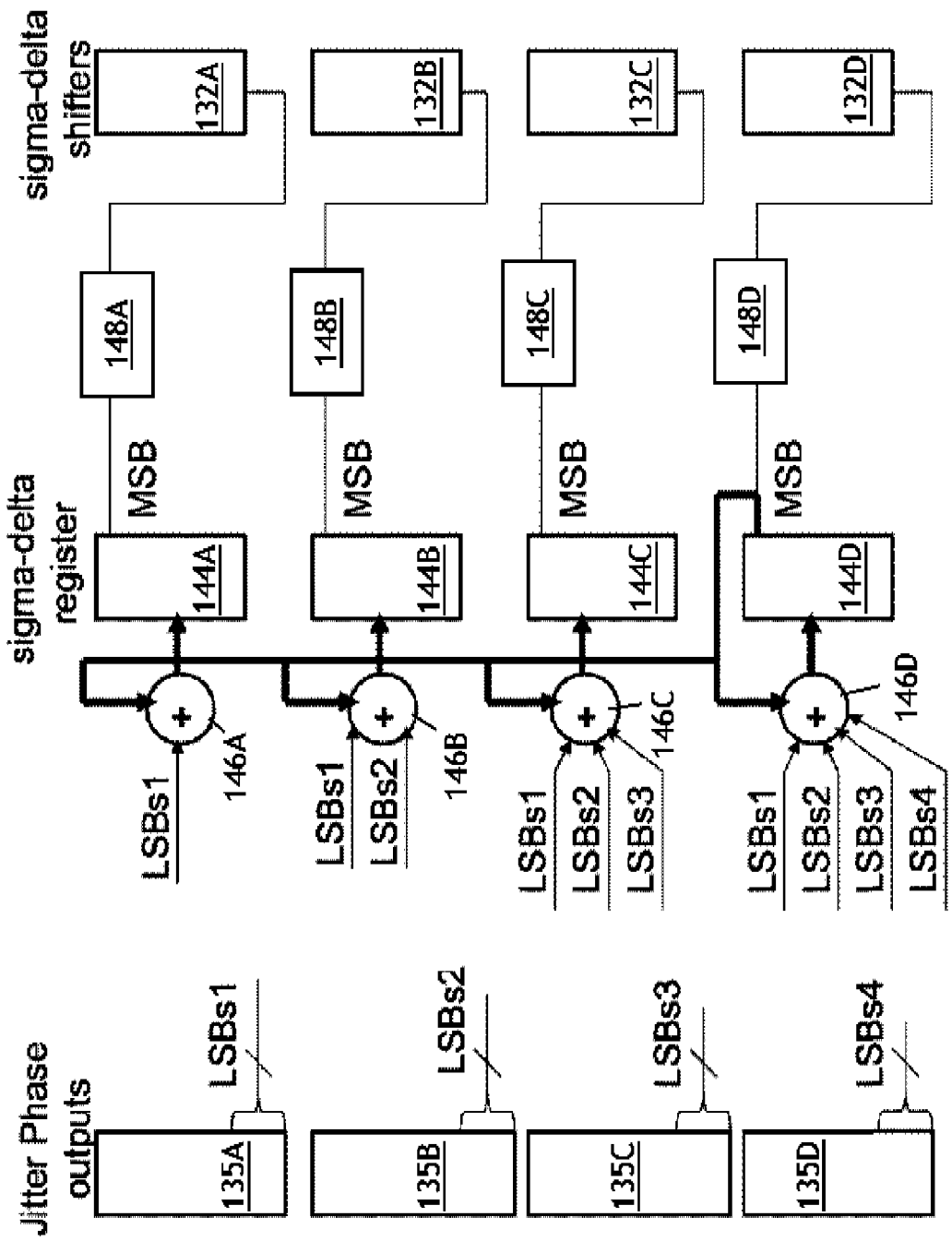
FIG. 14 is a block diagram of a control circuit for the plurality of the sigma-delta shifters.

The sigma-delta shifters 132A to 132D of FIG. 13 are controlled by separate sigma-delta registers. Referring to FIG. 14, four sigma-delta shifters 132A to 132D are controlled by four sigma-delta registers 144A to 144D, respectively. The four sigma-delta registers 144A to 144D are coupled to the four jitter phase outputs 135A to 135D, respectively. Four addition units 146A to 146C are used to accumulate the LSBs of the four jitter phase outputs 135A to 135D as shown. Four transition detectors 148A to 148D couple the most significant bits of the sigma-delta registers 144A to 144D to the sigma-delta shifters 132A to 132D, respectively. This sigma-delta modulation arrangement is similar to the arrangement for the sigma-delta modulation shown in FIG. 8. Its function is to provide the sigma-delta modulation to all four eight-bit words 138A to 138D, which are being serialized by the serializer unit 127 of the SERDES 123 at a single clock period of the 155.52 MHz clock signal 129.

Figure 15:
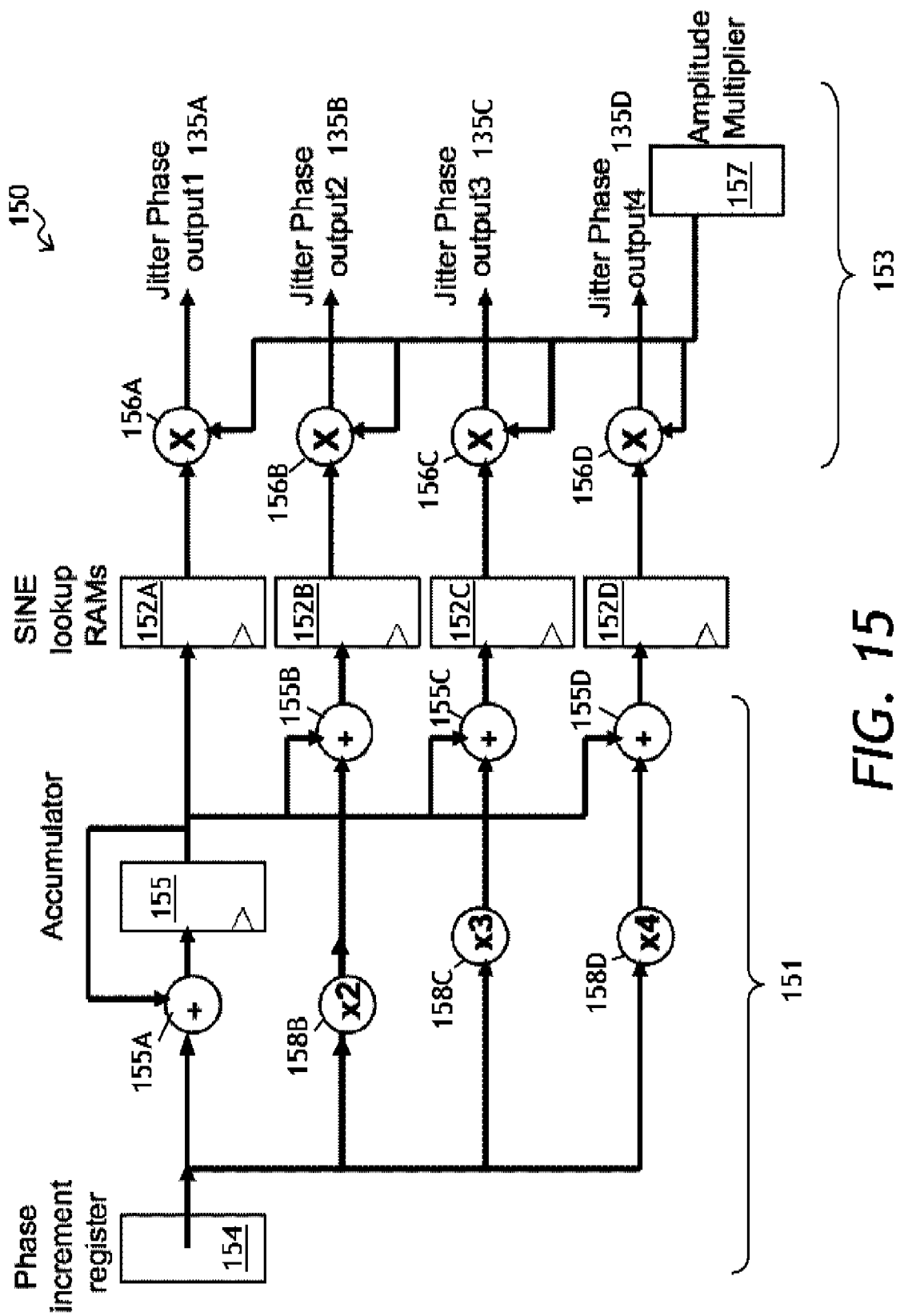
FIG. 15 is a block diagram of a barrel shifter controller for use in the binary number generator of FIG. 13.

Turning now to FIG. 15, a four-channel barrel shifter controller 150 is used to generate numbers to be placed in the jitter phase registers 135A to 135D. The barrel shifter controller 150 includes a four-channel ramp signal generator 151, four sine lookup RAM units 152A to 152D, and an optional four-channel output multiplier 153. The four-channel ramp signal generator 151 includes a phase increment register 154, an accumulator register 155, four summation modules 155A to 155D, and three ×2, ×3, and ×4 scaling modules 158B to 158D, respectively. The four-channel output multiplier 153 includes four multiplication units 156A to 156D and an amplitude modifier register 157. The operation of the four-channel barrel shifter controller 150 is similar to the operation of the single-channel barrel shifter controller 110 of FIG. 11. The four-channel barrel shifter controller 150 produces the four jitter phase outputs 135A to 135D. The function of the three ×2, ×3, and ×4 scaling modules 158B to 158D is to phase-shift the four jitter phase outputs 135A to 135D relative to each other. The amplitude of the jitter phase outputs 135A to 135D is determined by the amplitude multiplier 157.

It is to be understood that the number of registers used in parallel in the barrel shifter controller 150 may vary. The clock frequency will be reduced (divided) by the number of registers used in parallel. For example, the clock frequency of the four-channel barrel shifter controller 150 is four times lower than that of the single-channel barrel shift controller 110.

Figure 16:
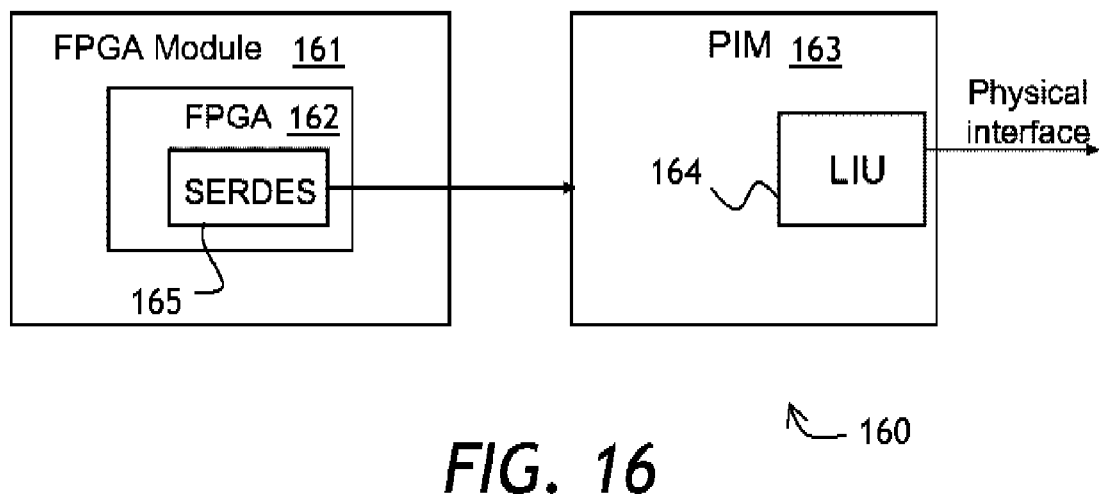
FIGS. 16 to 18 are block diagrams of a preferred implementation of a jittered signal generator of the invention, including a field programmable gate array (FPGA)-implemented SERDES.
Figure 17:
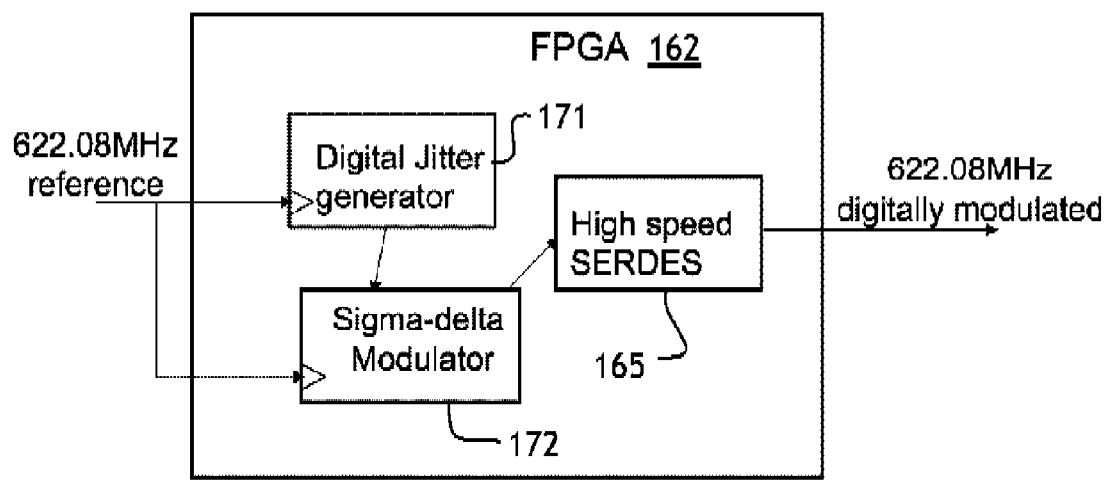
Figure 18:
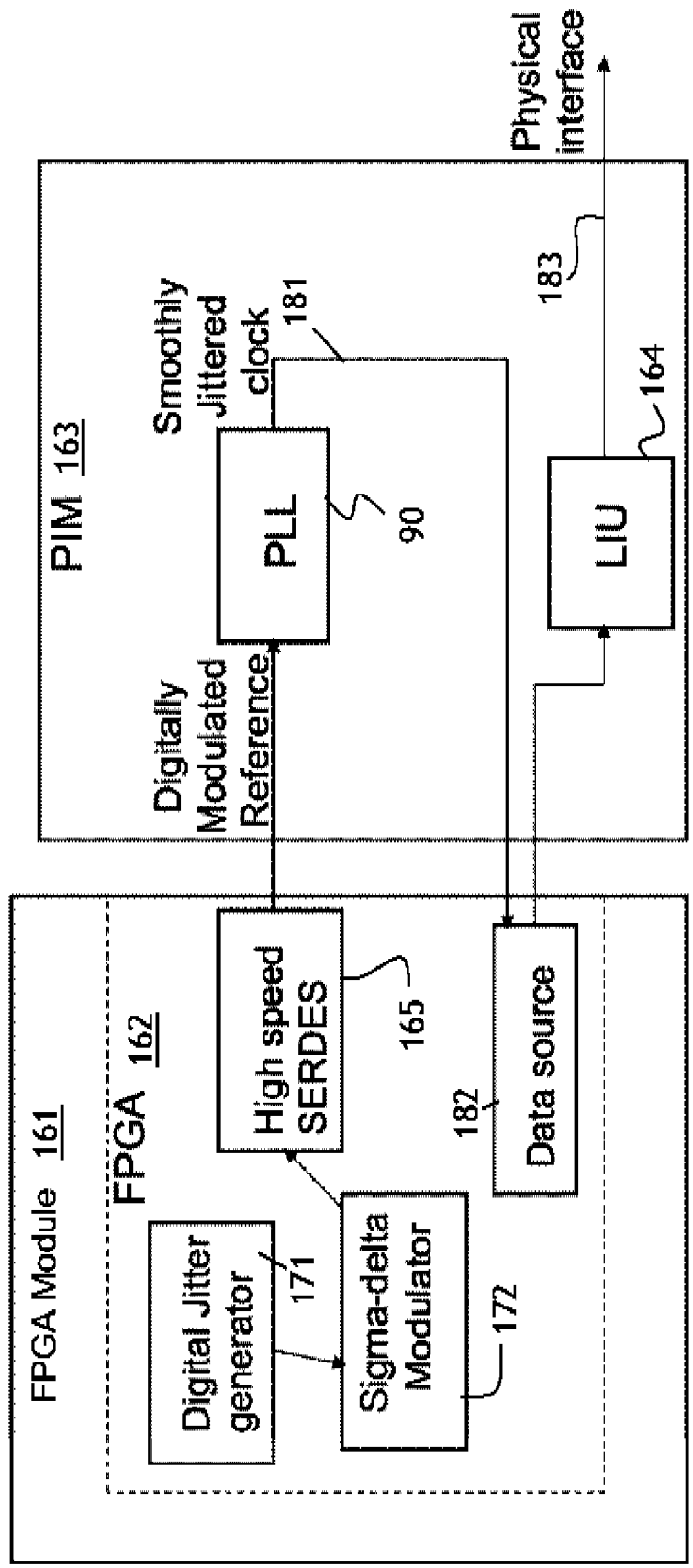

Hardware implementations of the jittered signal generator 130 of the invention will now be considered. Turning to FIGS. 16 to 18, a jittered signal generator 160 is implemented using a FPGA Module 161 coupled to a Physical Interface Module (PIM) 163, both of which are manufactured by JDS Uniphase Corporation having headquarters in California, USA. The FPGA Module 161 includes an FPGA 162 having implemented therein a SERDES module 165. The PIM module 163 has no FPGA circuitry, but has several plesiochronous digital hierarchy (PDH) physical interfaces, including a line interface unit (LIU) 164. Referring to FIGS. 17 and 18, a digital jitter generator 171, a sigma-delta modulator 172, and the SERDES 165 are implemented in the FPGA 162. The SERDES 165 corresponds to the SERDES 33 of FIGS. 5, 6, 8 and to the SERDES 123 of FIGS. 12 and 13. Turning to FIG. 18 specifically, the PLL 90 is implemented in PIM 163. A smoothly jittered clock signal 181 can be used as an output jittered digital signal, or, as shown in FIG. 18, it can be supplied to a data source 182 to be used for generation by the LIU 164 of a jittered data signal 183. The jittered clock signal 181 and/or the jittered data signal 183 have a pre-determined amount of jitter and can be used for testing electronic components and modules.

Other hardware implementations of the jittered signal generators 50, 60, 80, 120, and 130 of the invention are possible, depending on particular serializer architecture used. As disclosed above, using a barrel shifter to cyclically shift the parallel signal is preferable to provide the pre-determined amount of jitter. Further, preferably, sigma-delta modulation is used for modulating the cyclical shift produced by the barrel shifter. A phase-locked loop can be used for smoothing the cyclical shift modulated using sigma-delta modulation. Other phase smoothing arrangements can also be used.

The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for generating a jittered digital signal having first and second signal levels, the method comprising:
    (a) generating a first binary number including adjacent first and second groups of bits of all ones and all zeroes, respectively; and
    (b) serializing the first binary number using a serializer device forming a serially outputted group of bits of all ones and a serially outputted group of bits of all zeroes, so as to obtain the jittered digital signal,
        wherein the serially outputted group of bits of all ones corresponds to the first signal level, and the serially outputted group of bits of all zeroes corresponds to the second signal level of the jittered digital signal.
2. The method of claim 1, further comprising
    (c) smoothing a phase variation of the first binary number serialized in step (b), so as to smooth a phase variation of the jittered digital signal.
3. The method of claim 2, wherein in step (c), the smoothing is achieved by coupling a phase-locked feedback loop to an output of the serializer device.
4. The method of claim 1, comprising repeating steps (a) and (b), wherein in the repeated step (a), the total number of bits in at least one of the first group and the second group is changed, whereby the digital signal is jittered.
5. The method of claim 1, wherein step (a) includes
    providing an initial binary number having adjacent first and second groups of bits of all ones and all zeroes, respectively; and
    cyclically shifting the bits of the initial binary number, so as to generate the first binary number.

6. The method of claim 5, wherein the adjacent the first and the second groups of bits of the provided initial binary number have equal number of bits.

7. A jittered signal generator for generating a jittered digital signal having first and second signal levels, comprising:
- a binary number generator for generating a first binary number including adjacent first and second groups of bits of all ones and all zeroes, respectively; and
- a serializer device coupled to the binary number generator, for serializing the first binary number forming a serially outputted group of bits of all ones and a serially outputted group of bits of all zeroes, so as to obtain the jittered digital signal,
- wherein the serially outputted group of bits of all ones corresponds to the first signal level, and the serially outputted group of bits of all zeroes corresponds to the second signal level of the jittered digital signal.

8. The jittered signal generator of claim 7, further comprising a smoother for smoothing a phase variation of the jittered digital signal.

9. The jittered signal generator of claim 8, wherein the smoother comprises a sigma-delta modulator and/or a phase-locked feedback loop.

10. The jittered signal generator of claim 7, wherein the binary number generator comprises:
- an initial binary number register for storing an initial binary number having adjacent first and second groups of bits of all ones and all zeroes, respectively; and
- a barrel shifter for cyclically shifting the bits of the initial binary number provided by the initial binary number register, so as to generate the first binary number.

11. The jittered signal generator of claim 10, wherein the binary number generator further comprises a barrel shifter controller for controlling the barrel shifter by means of a jitter control signal.

12. The jittered signal generator of claim 11, wherein the barrel shifter controller comprises:
- a ramp signal generator for providing increasing ramp values; and
- a memory including a plurality of memory cells for storing a lookup table of values of the jitter control signal, wherein the memory is coupled to the ramp signal generator, so as to use the ramp values as addresses of the memory cells.

13. The jittered signal generator of claim 12, wherein the jitter control signal comprises a sinusoidal signal.

14. The jittered signal generator of claim 7, wherein the binary number generator includes
- a plurality of initial binary number registers each for storing an initial binary number having adjacent first and second groups of bits of all ones and all zeroes, respectively; and
- a plurality of barrel shifters, each such barrel shifter configured for cyclically shifting the bits of an initial binary number provided by one of the plurality of the initial binary number registers, so as to generate a plurality of intermediate binary numbers;
- wherein the plurality of the barrel shifters are operationally coupled to the serializer device such that the plurality of the intermediate binary numbers are combinable to form the first binary number for serializing by the serializer device,
- whereby a clock frequency for clocking the jittered signal generator is reduced n times, wherein n is the number of the initial binary number registers in the plurality of the initial binary number registers.

15. The jittered signal generator of claim 14,
- wherein the binary number generator further comprises a barrel shifter controller for controlling the plurality of the barrel shifters by means of a plurality of jitter control signals,
- wherein the barrel shifter controller includes
  - a ramp signal generator for providing increasing ramp values; and
  - a plurality of memory units, each such unit including a plurality of memory cells for storing a lookup table of values of the jitter control signal, wherein each of the plurality of the memory units is coupled to the ramp signal generator so as to use the ramp values as addresses of the corresponding memory cells;
- wherein each of the plurality of the memory units is coupled to a particular one of the plurality of barrel shifters, for providing a corresponding one of the plurality of jitter control signals.

16. Use of a serializer device for generation, from a parallel signal, of a clock signal or a serial binary data signal having a pre-determined amount of jitter,
- wherein the serializer device is FPGA-implemented;
- wherein a barrel shifter is used to cyclically shift the parallel signal to provide the pre-determined amount of jitter; and
- wherein sigma-delta modulation is used for modulating the cyclical shift produced by the barrel shifter.

17. The use of claim 16, wherein a phase-locked loop is used for smoothing the cyclical shift modulated using the sigma-delta modulation.

* * * * *